(12) United States Patent
Morooka

(10) Patent No.: US 12,538,483 B2
(45) Date of Patent: Jan. 27, 2026

(54) SEMICONDUCTOR DEVICE

(71) Applicant: Kioxia Corporation, Tokyo (JP)

(72) Inventor: Tetsu Morooka, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 644 days.

(21) Appl. No.: 17/896,934

(22) Filed: Aug. 26, 2022

(65) Prior Publication Data

US 2023/0200060 A1 Jun. 22, 2023

(30) Foreign Application Priority Data

Dec. 22, 2021 (JP) ................. 2021-207790

(51) Int. Cl.
*H10B 41/27* (2023.01)
(52) U.S. Cl.
CPC ................... *H10B 41/27* (2023.02)
(58) Field of Classification Search
None
See application file for complete search history.

(56) References Cited

U.S. PATENT DOCUMENTS

| 2014/0264532 | A1* | 9/2014 | Dennison ........... H10D 30/0413 |
| | | | 257/316 |
| 2016/0020225 | A1 | 1/2016 | Sakamoto et al. |
| 2017/0250189 | A1 | 8/2017 | Itokawa |
| 2020/0286902 | A1 | 9/2020 | Fukuda et al. |
| 2021/0057425 | A1 | 2/2021 | Han et al. |

FOREIGN PATENT DOCUMENTS

| JP | 2021-034486 A | 3/2021 |
| TW | 201735321 A | 10/2017 |
| TW | 201826547 A | 7/2018 |
| TW | I715111 B | 1/2021 |

* cited by examiner

*Primary Examiner* — Wael M Fahmy
(74) *Attorney, Agent, or Firm* — Foley & Lardner LLP

(57) ABSTRACT

A semiconductor device includes first conductive layers stacked in a first direction; a semiconductor film extending in the first direction; a first electrode film disposed between a corresponding one of the first conductive layers and the semiconductor film, and extending in a second direction; and a first insulating film disposed between the first conductive layer and the first electrode film. The first insulating film includes a first portion extending along a first sidewall of the first electrode film; a second portion that extends from an upper end of the first portion in a third direction to extend along an upper surface of the first electrode film; and a third portion that extends from a lower end of the first portion in the third direction to extend along a lower surface of the first electrode film.

10 Claims, 14 Drawing Sheets

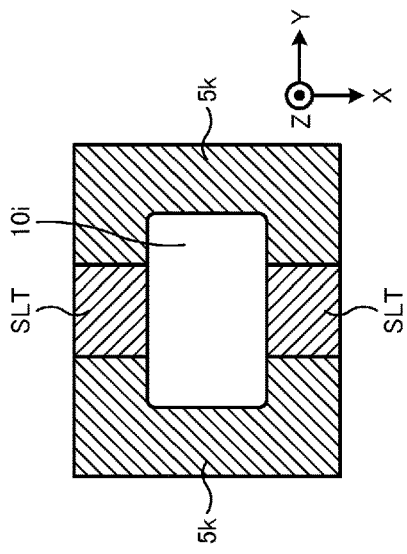
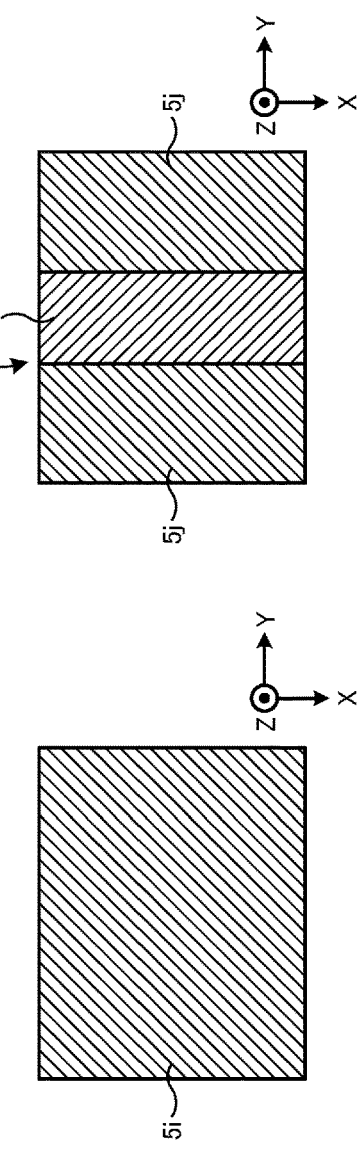
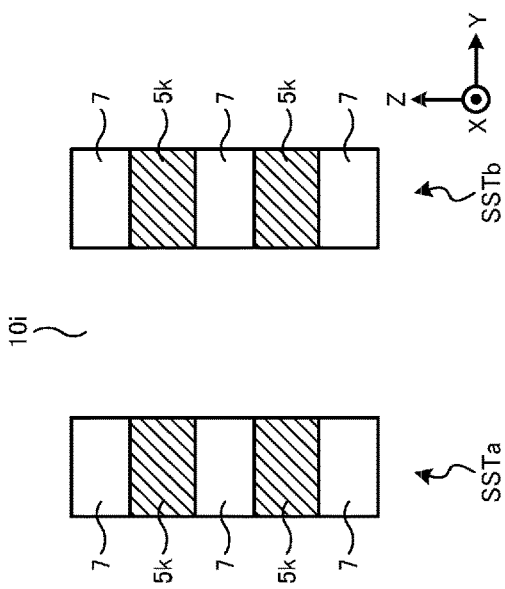
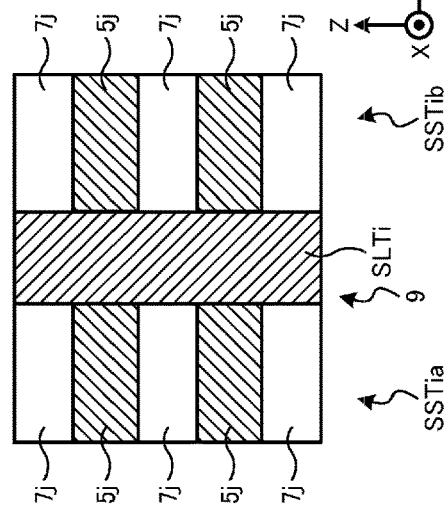
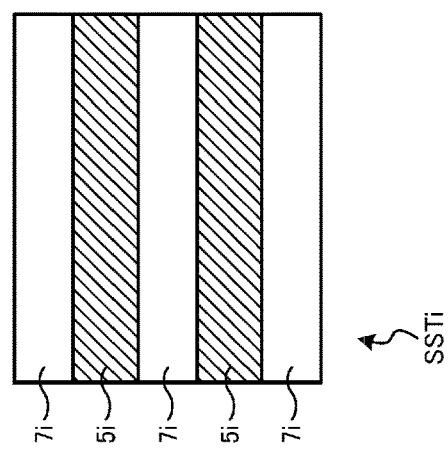

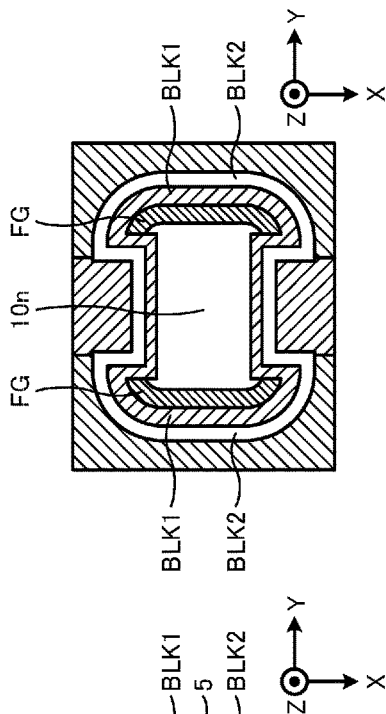
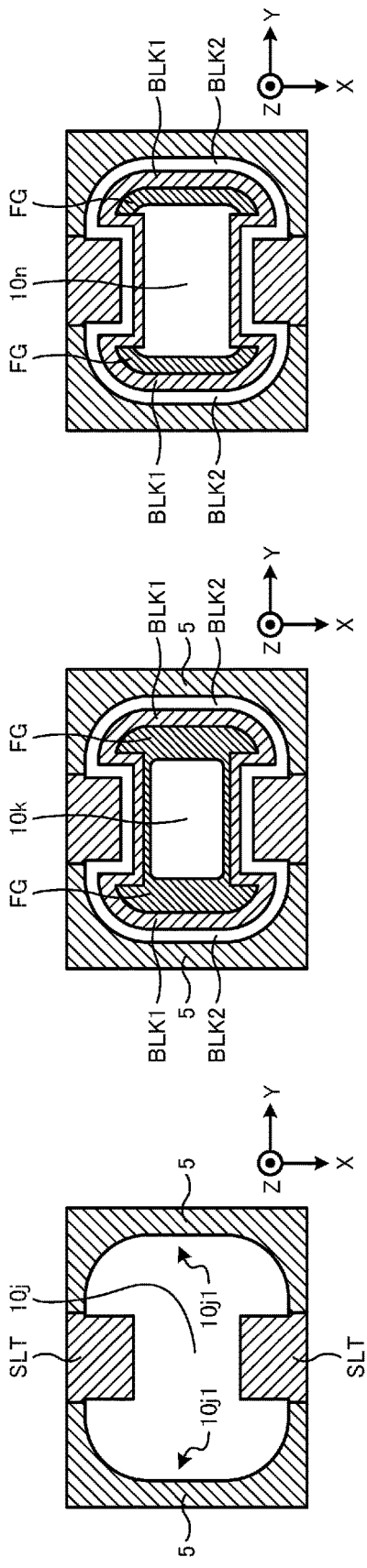
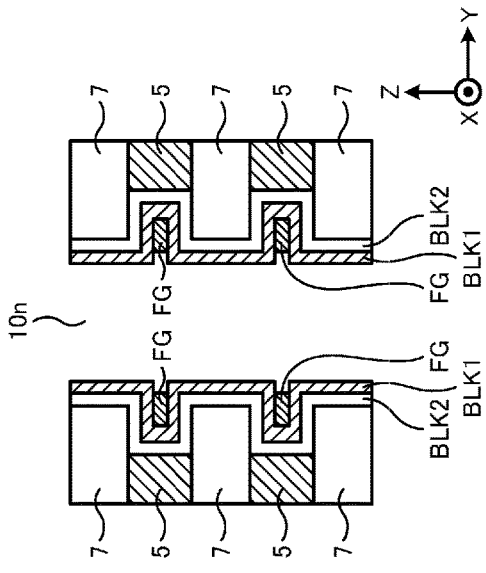
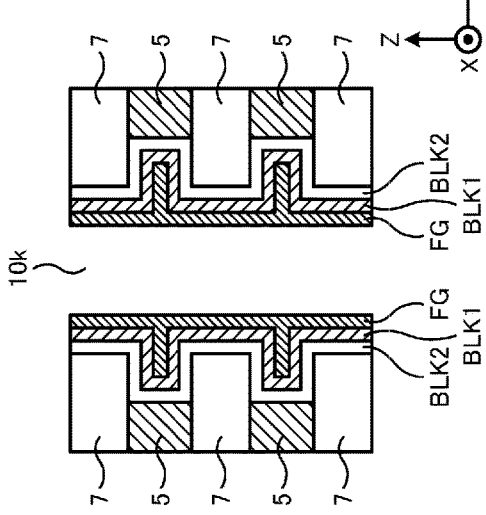
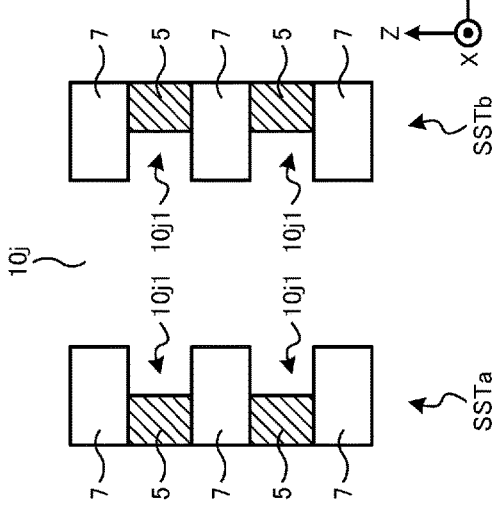

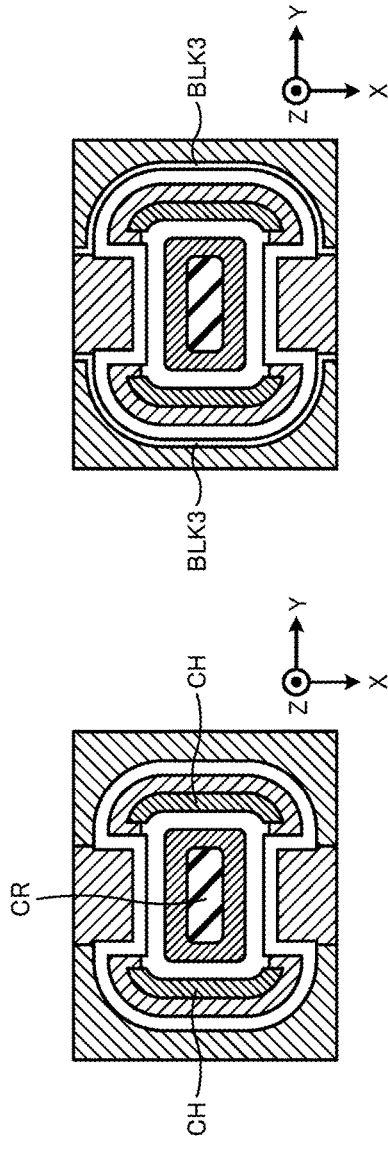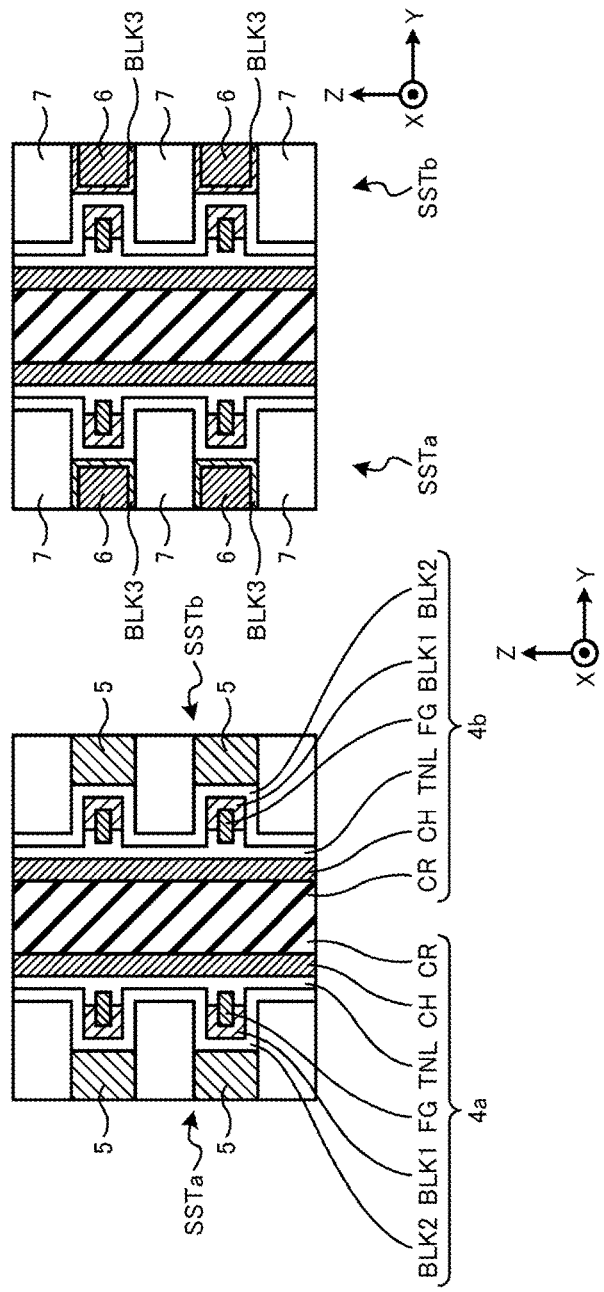

SEMICONDUCTOR DEVICE

CROSS-REFERENCE TO RELATED APPLICATION(S)

This application is based upon and claims the benefit of priority from Japanese Patent Application No. 2021-207790, filed Dec. 22, 2021, the entire contents of which are incorporated herein by reference.

FIELD

Embodiments described herein relate generally to a semiconductor device.

BACKGROUND

A semiconductor device may include a three-dimensional structure, in which inside a stacked structure where a plurality of conductive layers are stacked via insulating layers, a semiconductor film extends in the stacking direction such that a portion where each conductive layer and the semiconductor film are close to each other functions as a memory cell. In this semiconductor device, an improvement of operation reliability is required.

DESCRIPTION OF THE DRAWINGS

FIGS. 11A to 11F are views illustrating a method of manufacturing a semiconductor device according to a modification of the embodiment.

FIGS. 12A to 12F are views illustrating a method of manufacturing a semiconductor device according to a modification of the embodiment.

FIGS. 14A to 14D are views illustrating a method of manufacturing a semiconductor device according to a modification of the embodiment.

DETAILED DESCRIPTION

Embodiments provide a semiconductor device of which an operation reliability may be improved.

In general, according to one embodiment, a semiconductor device includes a first stacked structure including a plurality of first conductive layers stacked in a first direction; a semiconductor film extending in the first direction; a first electrode film disposed between a corresponding one of the first conductive layers and the semiconductor film, and extending in a second direction perpendicular to the first direction; and a first insulating film disposed between the first conductive layer and the first electrode film. The first insulating film includes a first portion extending along a first sidewall of the first electrode film that faces the first conductive layer; a second portion that extends from an upper end of the first portion in a third direction perpendicular to the first and second directions to extend along an upper surface of the first electrode film; and a third portion that extends from a lower end of the first portion in the third direction to extend along a lower surface of the first electrode film. A first distance in the third direction between an end surface of the second or third portion and a sidewall of the semiconductor film is larger than a second distance in the third direction between a second sidewall of the first electrode film and the sidewall of the semiconductor film.

Hereinafter, a semiconductor device according to an embodiment will be described in detail with reference to the accompanying drawings. It is noted that the present disclosure is not limited by these embodiments.

Embodiment

Figure 1:
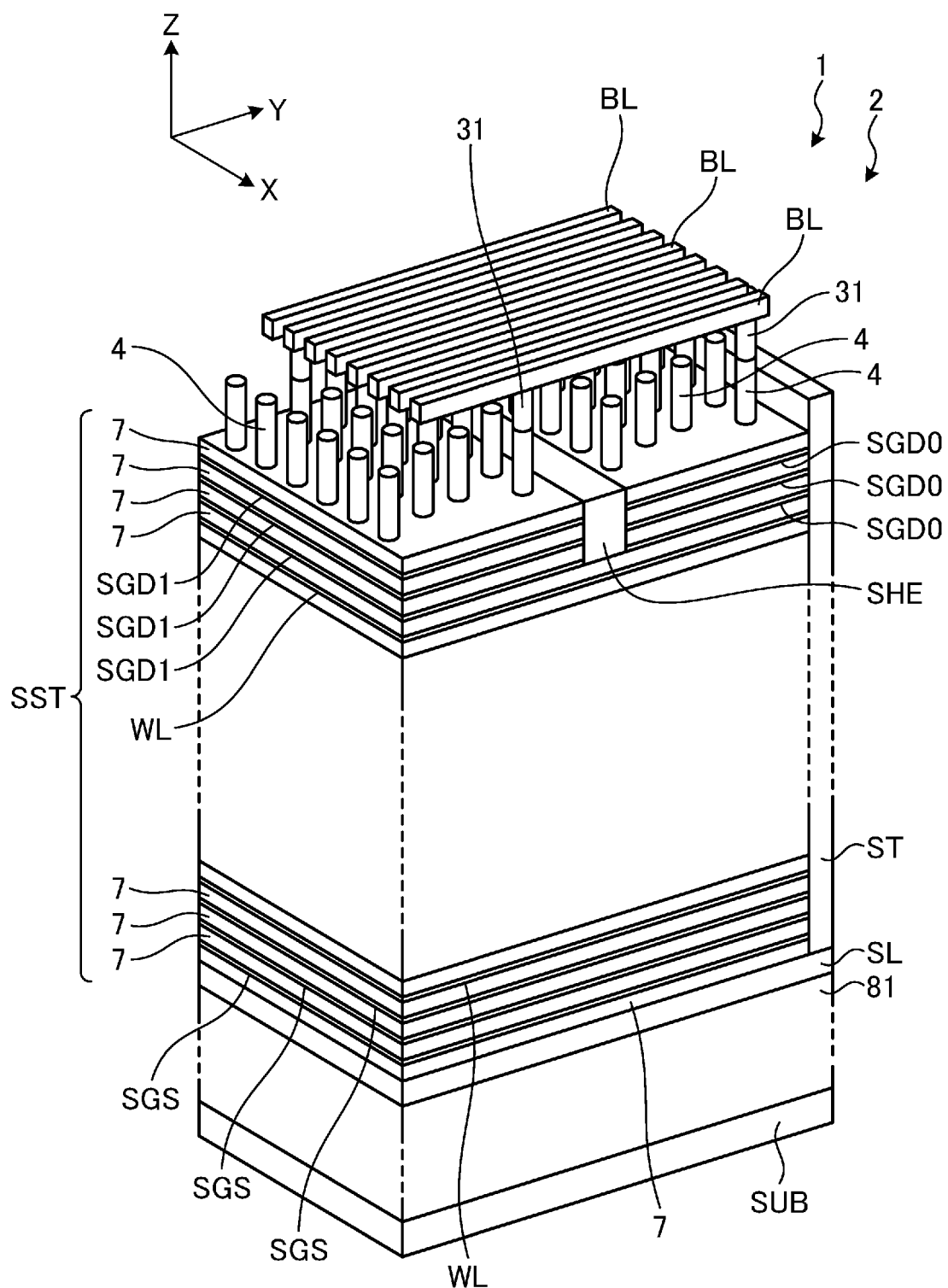
FIG. 1 is a perspective view illustrating a schematic configuration of a semiconductor device according to an embodiment.

While a semiconductor device according to an embodiment includes a three-dimensional memory cell array, it has been considered to implement a structure in which erasing and storing of electric charges are appropriately performed, in an electrode film of each memory cell in which electric charges may be stored. For example, a semiconductor device 1 may be configured as illustrated in FIG. 1. FIG. 1 is a perspective view illustrating a schematic configuration of the semiconductor device 1.

In the descriptions herein below, the directions perpendicular to each other in a plane parallel to the surface of a substrate SUB will be referred to as X and Y directions, respectively. More specifically, the X direction is a direction in which word lines WL extend, and the Y direction is a direction in which bit lines BL extend. A Z direction is a direction perpendicular to the surface of the substrate SUB. Thus, the Z direction is perpendicular to the X and Y directions.

As illustrated in FIG. 1, the semiconductor device 1 includes select gates SGS, word lines WL, and select gates SGD. The select gates SGS are stacked on the substrate SUB via insulating layers 7. In the example of FIG. 1, three layers are formed as the select gates SGS. The word lines WL are stacked on the uppermost select gate SGS via insulating layers 7. In the example of FIG. 1, a plurality of layers of word lines WL are formed alternately with the insulating layers 7 along the Z direction. The select gates SGD are stacked on the uppermost word line WL via insulating layers 7. Each of the select gates SGS, the word lines WL, and the select gates SGD has a plate shape that extends in the X direction and the Y direction.

In the example of FIG. 1, the select gates SGD, the word lines WL, and the select gates SGS are split and insulated in the Y direction by a slit ST. A source line SL is provided on the +Z side of the substrate SUB via an interlayer insulating film 81. The slit ST is formed on the +Z side of the source line SL, and extends in the X direction and the Y direction.

The select gates SGD are split in the Y direction by, for example, a split film SHE. The example of FIG. 1 represents select gates SGD0 and select gates SGD1 which are split in the Y direction. The split film SHE is provided above the word lines WL (on the +Z side), and extends in the X direction and the Z direction. Thus, the select gates SGD0 and the select gates SGD1 are arranged side by side in the Y direction on the word lines WL. In the example of FIG. 1, three layers of select gates SGD0 and three layers of select gates SGD1 are formed.

The substrate SUB is, for example, a silicon substrate. The select gates SGS, the word lines WL, and the select gates SGD are, for example, metal layers containing tungsten (W). The insulating layers 7 and the interlayer insulating film 81 are, for example, insulators containing silicon oxide.

The semiconductor device 1 further includes a plurality of columnar bodies 4. The columnar bodies 4 penetrate the select gates SGS, the word lines WL, and the select gates SGD, and extend in the Z direction which is the stacking direction thereof. The semiconductor device 1 further includes a plurality of bit lines BL provided above the select gates SGD.

Each columnar body 4 is electrically connected to a bit line BL via a contact plug 31. For example, one of the columnar bodies 4 sharing the select gates SGD0 and one of the columnar bodies 4 sharing the select gates SGD1 are electrically connected to one bit line BL.

In order to simplify the illustration, FIG. 1 omits an interlayer insulating film formed between the select gates SGD and the bit lines BL.

In the semiconductor device 1, the select gates SGD, the word lines WL, and the select gates SGS are each configured with a conductive layer. On the +Z side of the source line SL, a stacked structure SST in which conductive layers and insulating layers are alternately stacked is constructed. The columnar bodies 4 penetrate the stacked structure SST, so that the arrangement of three-dimensional memory cells (memory cell array) is implemented.

That is, in the semiconductor device 1, portions where the word lines WL and the columnar bodies 4 intersect each other function as memory cells, and a memory cell array 2 in which the plurality of memory cells are three-dimensionally arranged is implemented. Further, portions where the select gates SGS and the columnar bodies 4 intersect each other function as source-side select gates, and portions where the select gates SGD0 and SGD1 intersect the columnar bodies 4 function as drain-side select gates. In the semiconductor device 1, the storage capacity may be increased by increasing the number of stacked layers of the word lines WL in the stacked structure SST, without using a finer patterning technique.

Figure 2:
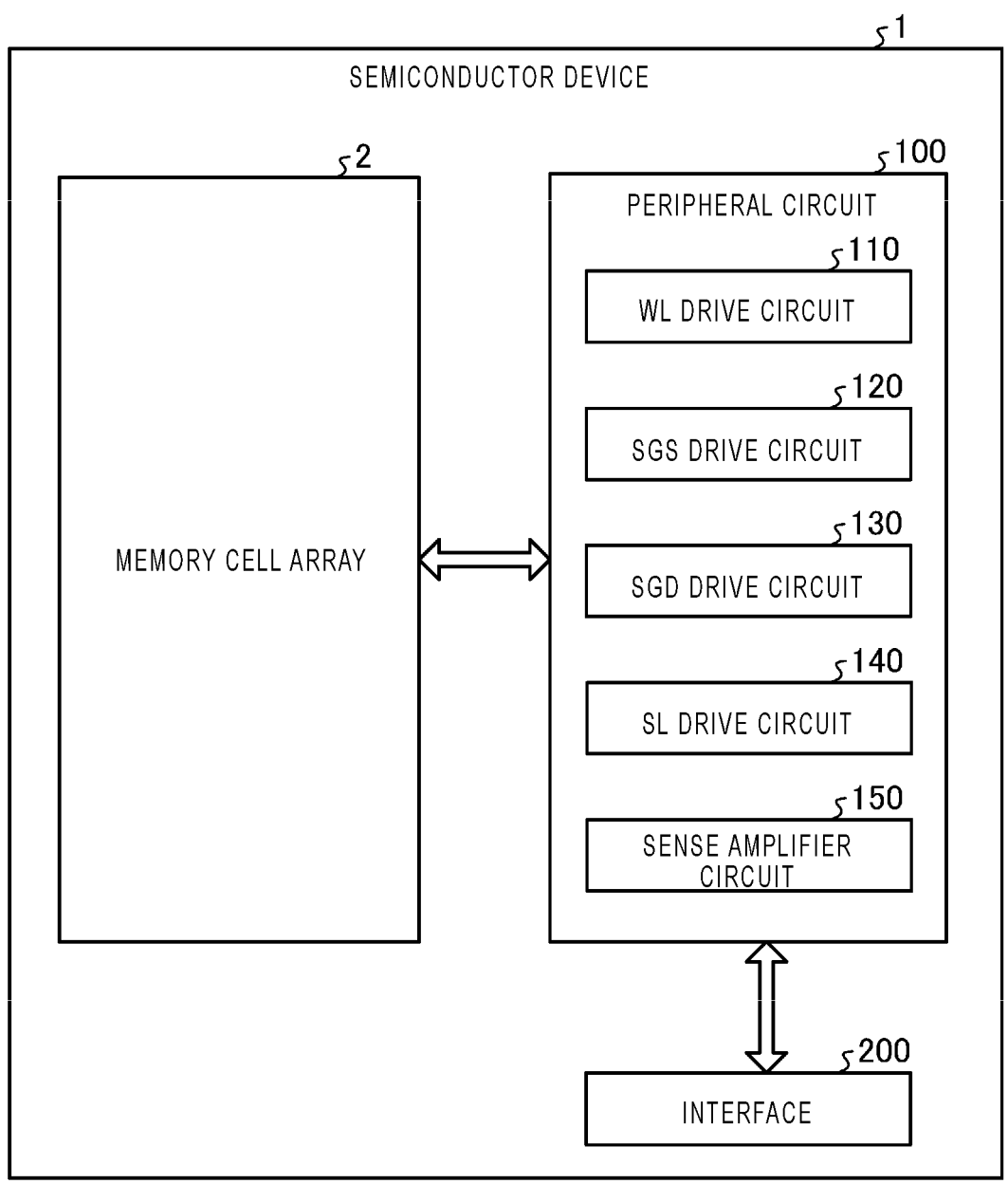
FIG. 2 is a block diagram illustrating a schematic configuration of a semiconductor device according to an embodiment.

FIG. 2 is a block diagram illustrating a schematic configuration of the semiconductor device 1. As illustrated in FIG. 2, the semiconductor device 1 includes a memory cell array 2, a peripheral circuit 100, and an interface 200. The peripheral circuit 100 includes a WL drive circuit 110, an SGS drive circuit 120, an SGD drive circuit 130, an SL drive circuit 140, and a sense amplifier circuit 150.

The WL drive circuit 110 controls a voltage applied to the word lines WL, and the SGS drive circuit 120 controls a voltage applied to the select gates SGS. The SGD drive circuit 130 controls a voltage applied to the select gates SGD, and the SL drive circuit 140 controls a voltage applied to the source line SL. The sense amplifier circuit 150 controls a voltage applied to the bit lines BL, and also determines data read according to a signal from a selected memory cell.

The peripheral circuit 100 controls the operation of the semiconductor device 1, based on an instruction input from the outside (e.g., a memory controller of a memory system to which the semiconductor device 1 is applied) via the interface 200.

Figure 3:
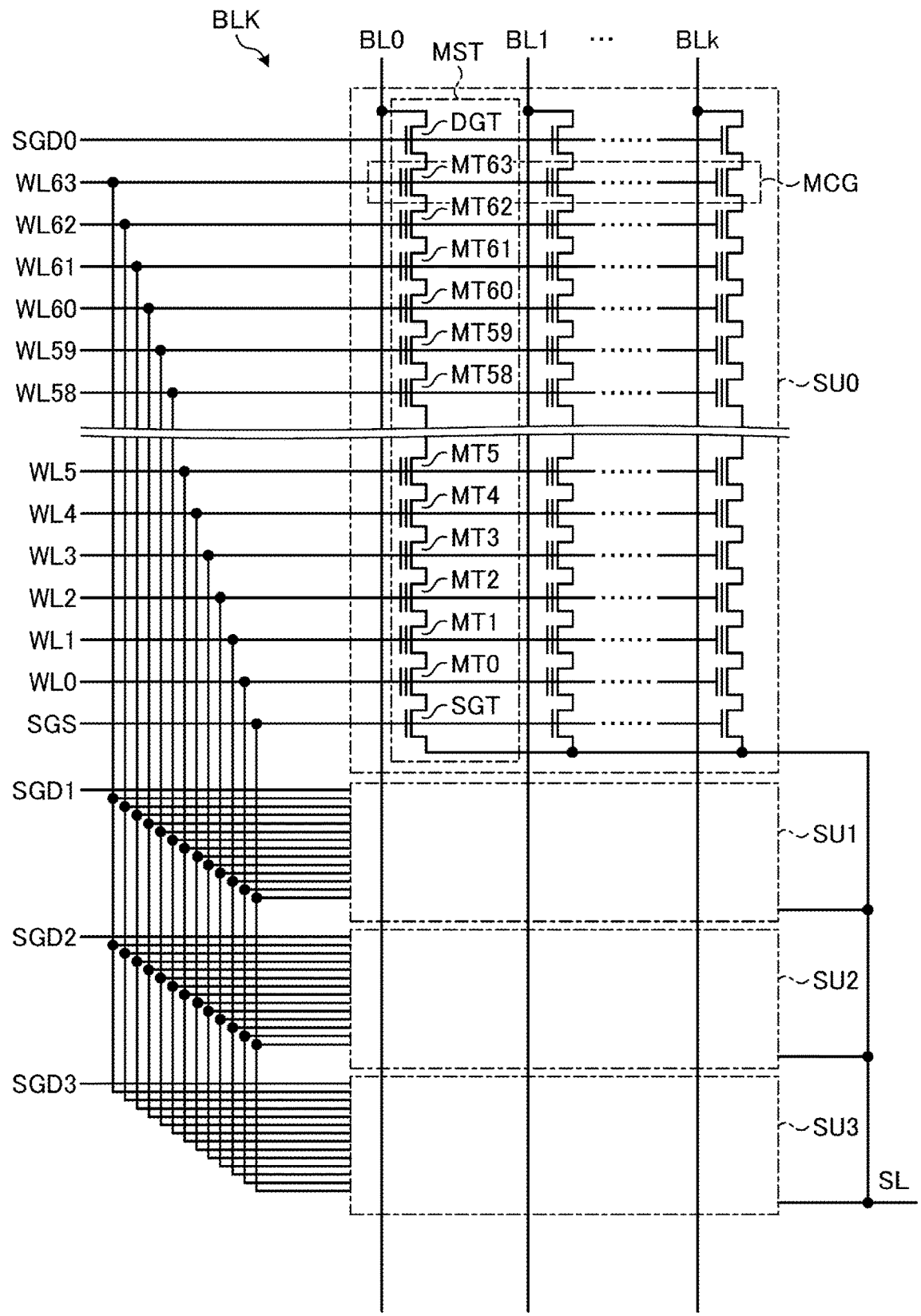
FIG. 3 is a circuit diagram illustrating a configuration of a memory cell array according to an embodiment.

Next, a circuit configuration of the memory cell array 2 will be described with reference to FIG. 3. FIG. 3 is a circuit diagram illustrating the configuration of the memory cell array 2.

The memory cell array 2 includes a plurality of blocks BLK which are each a set of a plurality of memory cell transistors MT. Hereinafter, the memory cell transistors MT will be simply referred to as memory cells MT.

Each block BLK includes a plurality of string units SU0, SU1, SU2, and SU3 which are each a set of the memory cells MT associated with the word lines WL and the bit lines BL. Each block BLK is associated with, for example, 64 word lines WL0 to WL63 and a k+1 number of bit lines BL0 to BLk. The "k" is any integer of 2 or more.

Each of the string units SU0 to SU3 includes a plurality of memory strings MST in which the memory cells MT are connected in series. Additionally, while FIG. 3 illustrates the four string units SU0 to SU3, the number of string units SU0 to SU3 may be two or less, or four or more. The number of memory strings MST in each string unit SU is freely selected.

The plurality of string units SU0, SU1, SU2, and SU3 are associated with a plurality of select gates SGD0, SGD1, SGD2, and SGD3, share the select gate SGS, and function as a plurality of drive units in each block BLK. Each string unit SU may be driven by its corresponding select gate SGD and the select gate SGS. Further, each string unit SU includes the plurality of memory strings MST.

Each memory string MST includes the memory cells MT at the positions thereof intersecting the word lines WL. For example, each memory string MST includes the 64 memory cells MT (MT0 to MT63) and select transistors DGT and SGT. Each memory cell MT includes a control gate and an electrode film, and is capable of storing data in a nonvolatile manner by storing electric charges in the electrode film. The 64 memory cells MT (MT0 to MT63) are connected in series between the source of the select transistor DGT and the drain of the select transistor SGT. Additionally, the number of memory cells MT in each memory string MST is not limited to 64.

The gates of the select transistors DGT in the respective string units SU0 to SU3 are connected to the select gates SGD0 to SGD3, respectively. Meanwhile, the gates of the select transistors SGT in the respective string units SU are commonly connected to, for example, the select gate SGS.

The drains of the select transistors DGT of the respective memory strings MST in each string unit SU are connected to the different bit lines BL0 to BLk, respectively. Further, each of the bit lines BL0 to BLk is connected in common to one memory string MST in each string unit SU throughout the plurality of blocks BLK. Further, the sources of the respective select transistors SGT are connected in common to the source line SL.

That is, the string unit SU is a set of the memory strings MST connected to the different bit lines BL0 to BLk and further connected to the same select gate SGD. Further, each block BLK is a set of the plurality of string units SU0 to SU3 sharing the word lines WL. The memory cell array 2 is a set of the plurality of blocks BLK sharing the bit lines BL0 to BLk.

When a group of memory cells MT sharing each word line WL is referred to as a "memory cell group MCG", the memory cell group MCG is the smallest unit of a set of memory cells MT to which a predetermined voltage (e.g., a write voltage or a read voltage) may be collectively applied through the word line WL.

Figure 4:
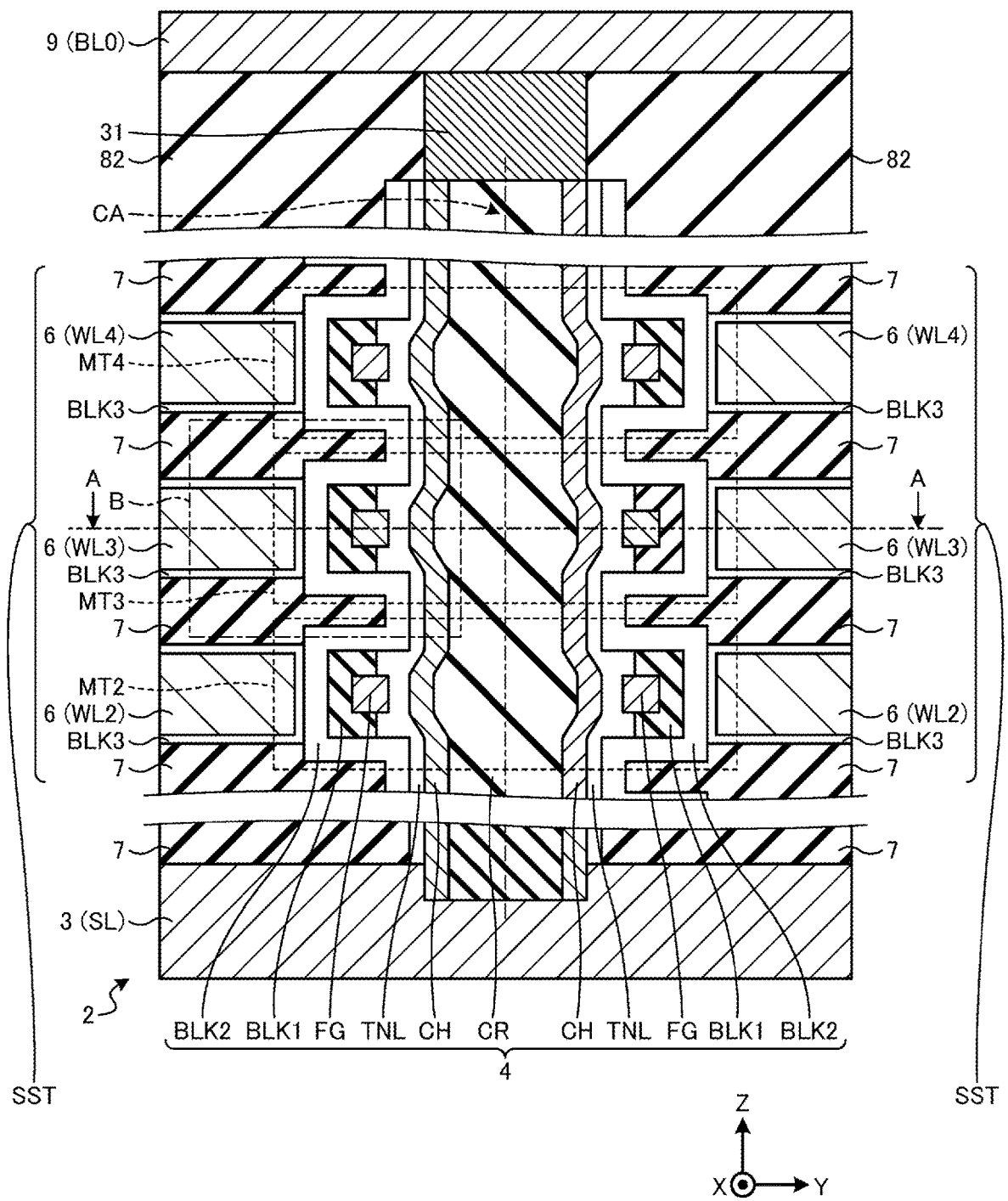
FIG. 4 is a vertical cross-sectional view illustrating a configuration of a memory cell array according to an embodiment.

Next, the cross-sectional configuration of the memory cell array 2 will be described with reference to FIG. 4. FIG. 4 is a cross-sectional view illustrating the configuration of the memory cell array 2.

In the semiconductor device 1, a conductive layer 3 is provided on the +Z side of the substrate SUB via the interlayer insulating film 81. The conductive layer 3 may be formed of a material containing a semiconductor containing impurities (e.g., silicon) as a main component or a material containing a conductor (e.g., metal such as tungsten or the like) as a main component. The conductive layer 3 extends in a plate shape in the XY direction to function as the source line SL (see FIG. 1). The plurality of columnar bodies 4 are provided on the +Z side of the conductive layer 3. FIG. 4 illustrates one of the plurality of columnar bodies 4. The plurality of columnar bodies 4 are arranged in the XY direction. Each columnar body 4 extends in the Z direction inside the stacked structure SST (see FIG. 1).

Each columnar body 4 has a columnar shape with a central axis CA along the Z direction, and has, for example, a substantially circular columnar shape. Each columnar body 4 may have a tapered shape in which the diameter at the −Z-side end is narrower than that at the +Z-side end. Each columnar body 4 or 4c may have a bowing shape in which the diameter at the −Z-side end is narrower than that at the +Z-side end, and the diameter becomes wide at a predetermined Z position between the +Z-side end and the −Z-side end. For the simplification of illustration, FIG. 4 represents the substantially circular columnar shape as the shape of each columnar body 4.

Figure 5:
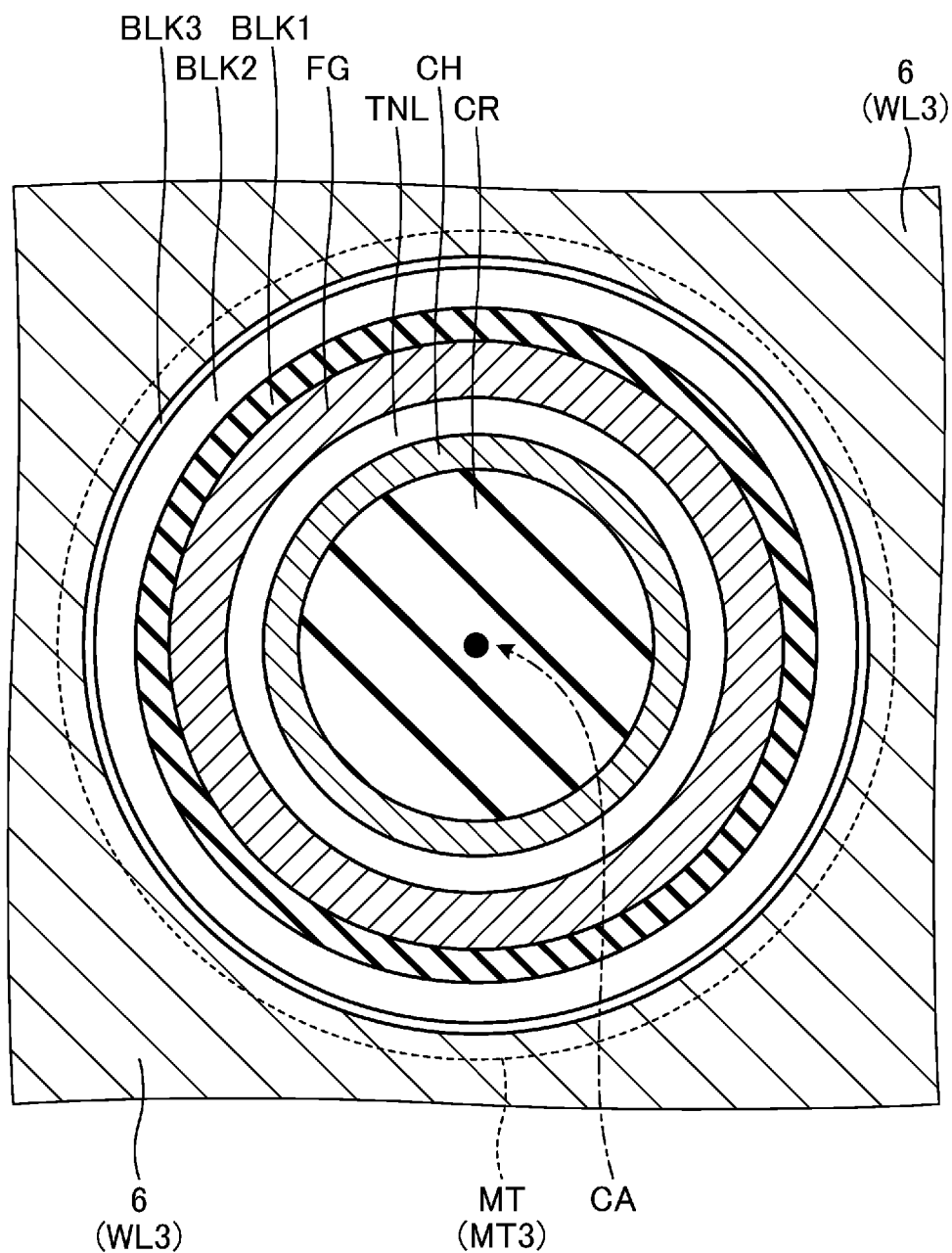
FIG. 5 is a horizontal cross-sectional view illustrating a configuration of a memory cell according to an embodiment.

As illustrated in FIGS. 4 and 5, the columnar body 4 includes a core member CR, a semiconductor film CH, an insulating film TNL, a plurality of electrode films FG, an insulating film BLK1, and an insulating film BLK2 in this order from the central axis CA. FIG. 5 is an enlarged cross-sectional view illustrating the configuration of the memory cell MT in the XY direction, and an enlarged view of an XY cross-sectional view obtained by cutting FIG. 4 along the line AA.

The core member CR is disposed near the central axis CA of the columnar body 4, and has a substantially circular columnar shape that extends along the central axis CA of the columnar body 4. The core member CR may be formed of a material containing an insulator (e.g., semiconductor oxide such as silicon oxide or the like) as a main component.

The semiconductor film CH surrounds the core member CR outside, and has a substantially cylindrical shape that extends along the central axis CA of the columnar body 4. The semiconductor film CH may be formed of a material containing a semiconductor that does not substantially contain impurities (e.g., polysilicon), as a main component.

The insulating film TNL surrounds the semiconductor film CH outside, and has a substantially cylindrical shape that extends along the central axis CA of the columnar body 4. The insulating film TNL may be formed of a material containing an insulator (e.g., silicon oxide) as a main component.

The plurality of electrode films FG are arranged in the Z direction along the central axis CA while being spaced apart from each other in the Z direction. Each electrode film FG is disposed at a Z position corresponding to a conductive layer 6. Each electrode film FG surrounds the insulating film TNL outside, and has a substantially disk shape with the central axis CA therein. The electrode film FG may be formed of a material containing a conductor (e.g., polysilicon imparted with a conductivity) as a main component.

The insulating film BLK1 surrounds the electrode film FG outside, and has a substantially disk shape with the central axis CA therein. The insulating film BLK1 may be formed of a material containing an insulator having a higher permittivity than that of the insulating film TNL and/or the insulating film BLK2 (e.g., metal oxide, metal nitride, or metal carbide such as $Si_3N_4$, $Al_2O_3$, $HfO_2$, HfSiON, HfAlON, or the like).

The insulating film BLK2 surrounds the insulating film BLK1, the electrode film FG, and the insulating film TNL outside in the XY cross-sectional view, and has a shape in which a cylinder with a relatively large diameter and a cylinder with a relatively small diameter are alternately stacked in the Z direction along the central axis CA, while extending substantially in the Z direction along the outer contours of the insulating films BLK1 and TNL in the cross-sectional view including the central axis CA (e.g., the YZ cross-sectional view). The insulating film BLK2 may be formed of a material containing an insulator (e.g., silicon oxide, metal oxide, or a stack thereof) as a main component.

The semiconductor film CH of the columnar body 4 is connected to the conductive layer 3 which is the source line SL on the −Z side, and connected to a conductive layer 9 functioning as a bit line BL via the contact plug 31 on the +Z side. That is, the semiconductor film CH includes a channel area (active area) in the memory string MST.

In the stacked structure SST, the conductive layers 6 and the insulating layers 7 are stacked alternately and repeatedly. Each conductive layer 6 extends in a plate shape in the XY direction. Each conductive layer 6 may be formed of a material containing a conductor (e.g., metal such as tungsten or the like) as a main component. In each conductive layer 6, the +Z-side surface, the −Z-side surface, and the surface facing the columnar body 4 may be covered with an insulating film BLK3. The insulating film BLK3 may have a different composition from that of the insulating films BLK1 and BLK2. The insulating film BLK3 may be formed of a material containing an insulator (e.g., aluminum oxide) as a main component. Each insulating layer 7 extends in a plate shape in the XY direction. Each insulating layer 7 may be formed of a material containing an insulator (e.g., semiconductor oxide such as silicon oxide or the like) as a main component.

Among the plurality of conductive layers 6 of the stacked structure SST that are spaced apart from each other in the Z direction, the conductive layer 6 closest to the −Z side functions as the select gate SGS, the conductive layer 6 closest to the +Z side functions as the select gate SGD, and the other conductive layers 6 function as the word lines WL0 to WL63. FIG. 5 represents the conductive layers 6 that function as the word lines WL2 to WL4.

The select transistor SGT is formed at the position where the conductive layer 6 of the select gate SGS (not illustrated) intersects the semiconductor film CH and an electric charge storage film CT. The memory cell MT0 is formed at the position where the conductive layer 6 of the word line WL0 (not illustrated) intersects the semiconductor film CH and the electric charge storage film CT. The memory cell MT1 is formed at the position where the conductive layer 6 of the word line WL1 (not illustrated) intersects the semiconductor film CH and the electric charge storage film CT. The memory cell MT2 is formed at the position where the conductive layer 6 of the word line WL2 (not illustrated) intersects the semiconductor film CH and the electric charge storage film CT. The memory cell MT3 is formed at the position where the conductive layer 6 of the word line WL3 intersects the semiconductor film CH and the electric charge storage film CT. The memory cell MT4 is formed at the position where the conductive layer 6 of the word line WL4 intersects the semiconductor film CH and the electric charge storage film CT. The select transistor DGT is formed at the position where the conductive layer 6 of the select gate SGD (not illustrated) intersects the semiconductor film CH and the electric charge storage film CT. Additionally, in the columnar body 4, the electric charge storage film CT and the insulating film BLK2 may be partially omitted at the position where the columnar body 4 intersects the conductive layer 6 of the select gate SGD.

Figure 6:
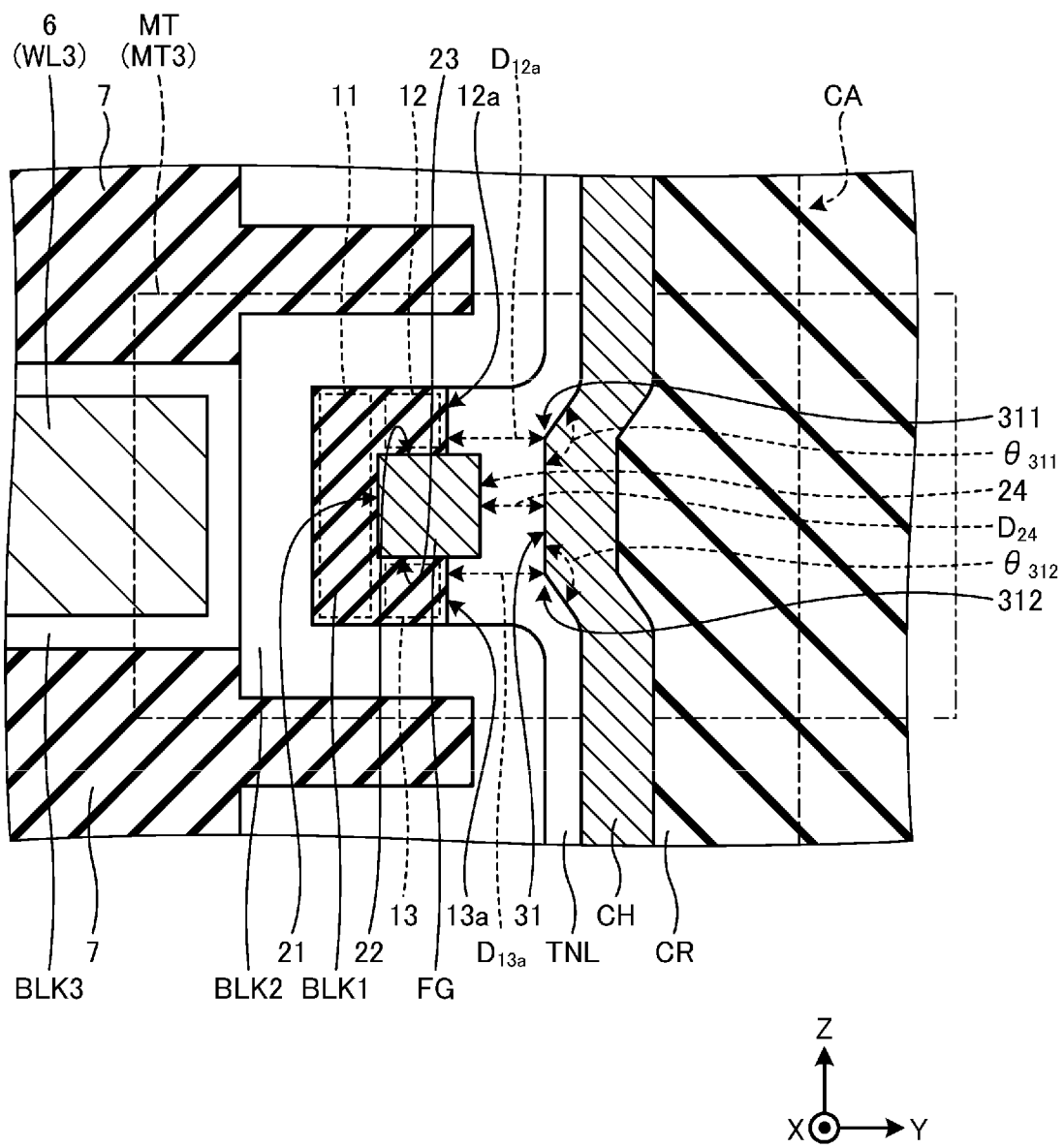
FIG. 6 is an enlarged vertical cross-sectional view illustrating a configuration of a memory cell according to an embodiment.

Next, the detailed configuration of the memory cell MT will be described with reference to FIGS. 5 and 6. FIG. 6 is an enlarged cross-sectional view illustrating the configuration of the memory cell MT, and is an enlarged cross-sectional view of the portion B in FIG. 4.

As illustrated in FIGS. 5 and 6, in the memory cell MT, the electrode film FG in which electric charges are to be stored is disposed between the conductive layer 6 functioning as the word line WL and the semiconductor film CH. The insulating films BLK1 to BLK3 are disposed between the electrode film FG and the conductive layer 6, and the insulating film TNL is disposed between the electrode film FG and the semiconductor film CH. As a result, the electric potential of the electrode film FG is set to a floating potential, and thus, the electrode film FG functions as a floating electrode.

As illustrated in FIG. 6, in the cross-sectional view including the central axis CA (e.g., the YZ cross-sectional view including the central axis CA), the electrode film FG has an island shape (e.g., a substantially rectangular shape), and the insulating film BLK1 has a horizontal U shape which is opened toward the central axis CA to partially include the electrode film FG therein. Thus, when viewed in the radial direction from the central axis CA (e.g., in the Y direction in the YZ cross section including the central axis CA), the electrode film FG protrudes from the insulating film BLK1, and the insulating film BLK1 is recessed from the electrode film FG, with respect to the semiconductor film CH.

For example, the insulating film BLK1 has portions 11, 12, and 13. The portion 11 covers the surface 21 of the electrode film FG that faces the conductive layer 6. The width of the portion 11 in the Z direction is larger than the width of the electrode film FG in the Z direction. The portion 12 extends from the +Z-side end of the portion 11 toward the central axis CA in the XY plane direction, to cover the +Z-side surface 22 of the electrode film FG. The plane width of the portion 12 is smaller than the plane width of the electrode film FG in the radial direction from the central axis CA. The portion 13 extends from the -Z-side end of the portion 11 toward the central axis CA in the XY plane direction, to cover the -Z-side surface 23 of the electrode film FG. The plane width of the portion 13 is smaller than the plane width of the electrode film FG in the radial direction from the central axis CA.

At the position where the memory cell MT is formed, $D_{12a}$ refers to the distance between the end surface 12a of the portion 12 that faces the central axis CA in the radial direction from the central axis CA, and the side surface 31 of the semiconductor film CH opposite to the central axis CA. Further, $D_{24}$ refers to the distance between the end surface 24 of the electrode film FG that faces the central axis CA in the radial direction from the central axis CA, and the side surface 31 of the semiconductor film CH opposite to the central axis CA. The distance $D_{12a}$ is longer than the distance $D_{24}$. At the position where the memory cell MT is formed, $D_{13a}$ refers to the distance between the end surface 13a of the portion 13 that faces the central axis CA in the radial direction from the central axis CA, and the side surface 31 of the semiconductor film CH opposite to the central axis CA. The distance $D_{13a}$ is longer than the distance $D_{24}$. That is, the following equations are established.

$$D_{12a} > D_{24} \qquad \text{Equation 1}$$

$$D_{13a} > D_{24} \qquad \text{Equation 2}$$

Equation 1 represents that the electrode film FG protrudes from the portion 12, and the portion 12 is recessed from the electrode film FG, with respect to the semiconductor film CH, in the radial direction from the central axis CA. Equation 2 represents that the electrode film FG protrudes from the portion 13, and the portion 13 is recessed from the electrode film FG, with respect to the semiconductor film CH, in the radial direction from the central axis CA.

Further, in the cross-sectional view including the central axis CA, the side surface 31 of the semiconductor film CH opposite to the central axis CA extends substantially flat in the Z direction. For example, the side surface 31 of the semiconductor film CH opposite to the central axis CA has a stepped portion 311 near the Z position corresponding to the portion 12, and a stepped portion 312 at the Z position corresponding to the portion 13. Assuming that the angle formed by the stepped portion 311 inside the semiconductor film CH is $\theta_{311}$, the angle $\theta_{311}$ forms an obtuse angle. Assuming that the angle formed by the stepped portion 312 inside the semiconductor film CH is $\theta_{312}$, the angle $\theta_{312}$ forms an obtuse angle. That is, the following equations 3 and 4 are established.

$$90° < \theta_{311} \leq 180° \qquad \text{Equation 3}$$

$$90° < \theta_{312} \leq 180° \qquad \text{Equation 4}$$

Equation 3 represents that the stepped portion 311 is a gentle step extending substantially flat in the Z direction. Equation 4 represents that the stepped portion 312 is a gentle step extending substantially flat in the Z direction.

Figure 7A:
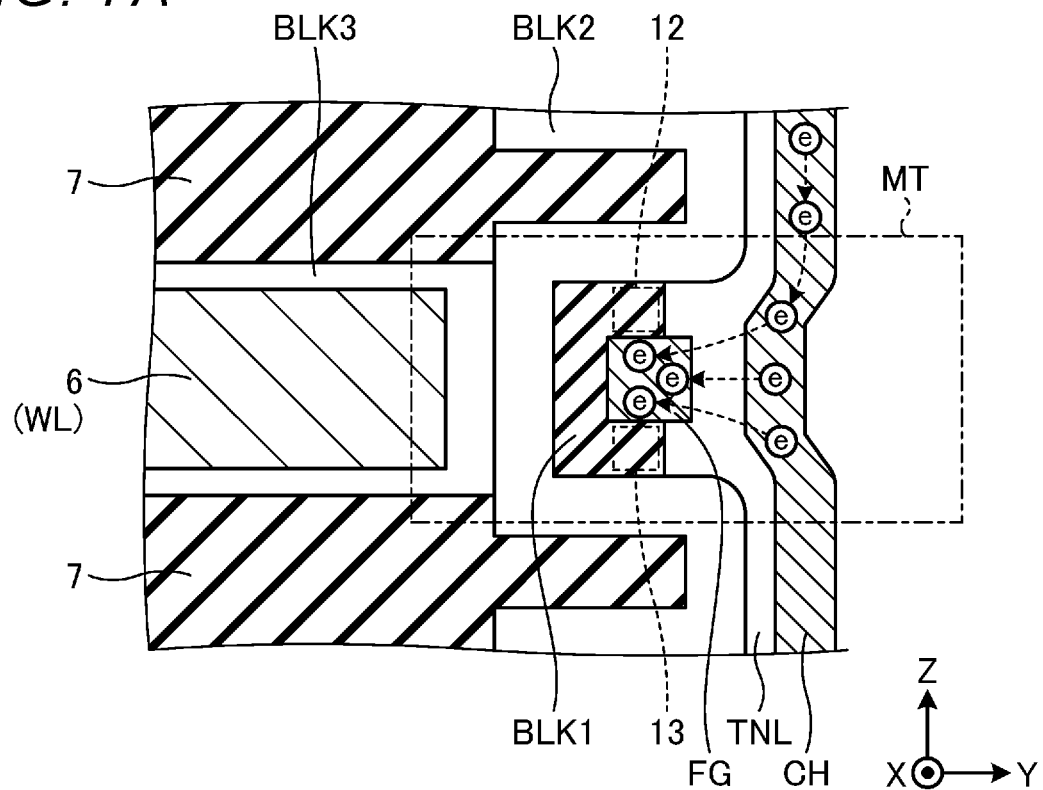
FIGS. 7A and 7B are vertical cross-sectional views illustrating an operation of a memory cell according to an embodiment.
Figure 7B:
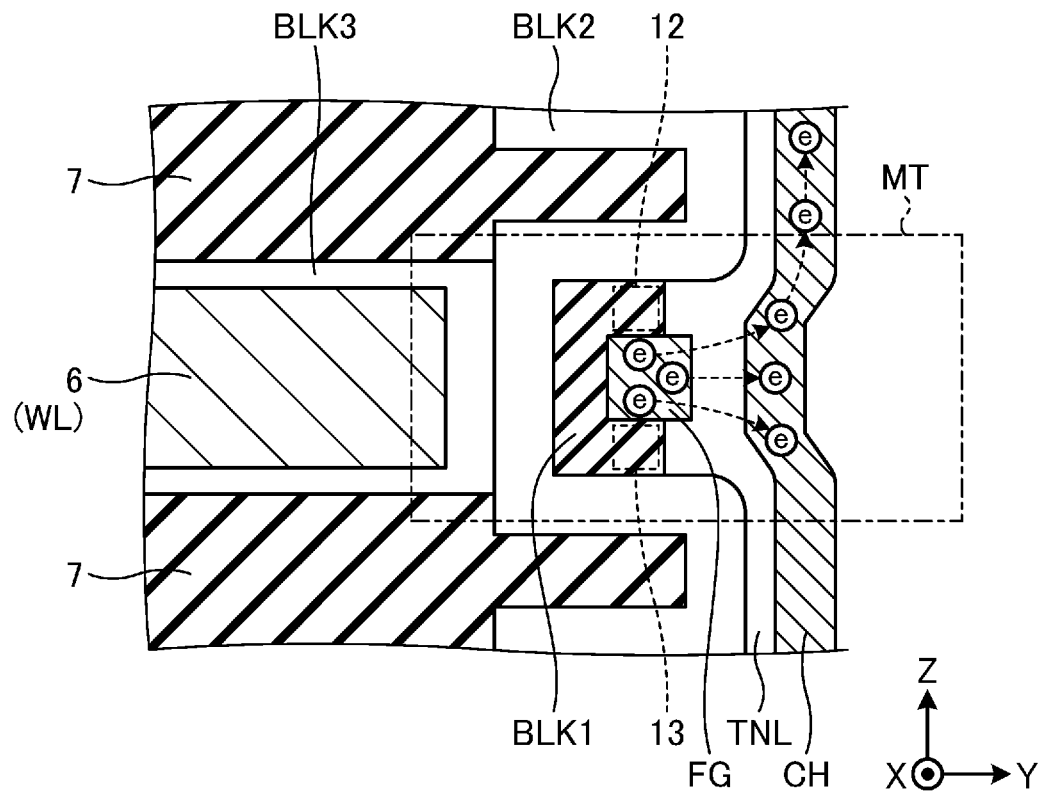

Next, the operation of the memory cell MT will be described with reference to FIGS. 7A and 7B. FIGS. 7A and 7B are cross-sectional views illustrating the operation of the memory cell MT. FIG. 7A illustrates an operation of writing information to the memory cell MT, and FIG. 7B illustrates an operation of erasing information from the memory cell MT.

During the operation of writing information to the memory cell MT, as illustrated in FIG. 7A, a write voltage is applied to the conductive layer 6 of a selected word line WL, a transfer voltage is applied to the conductive layers 6 of non-selected word lines WL, and a reference voltage is applied to the semiconductor film CH. The write voltage has an electric potential (e.g., 20 V) for drawing electric charges (electrons) of the semiconductor film CH into the electrode film FG. The transfer voltage has an electric potential (e.g., 10 V) between the write voltage and the reference voltage. The reference voltage has a reference electric potential (e.g., 0 V). As a result, electric charges are stored in the electrode film FG of the selected memory cell MT formed at the position where the conductive layer 6 of the selected word line WL intersects the semiconductor film CH and the electrode film FG, and information is written to the selected memory cell MT.

At this time, as represented in Equations 1 and 2, the distance from the semiconductor film CH to the insulating film BLK1 is farther than the distance from the semiconductor film CH to the electrode film FG, so that the generation of electric field in the direction from the semiconductor film CH toward the insulating film BLK1 may be prevented. Further, as represented in Equations 3 and 4, the side surface 31 of the semiconductor film CH is substantially flat in the Z direction at the Z positions corresponding to the portions 12 and 13 of the insulating film BLK1, so that the electric field may be prevented from being generated intensively at the Z positions corresponding to the portions 12 and 13. That is, since the electrode film FG protrudes from the portions 12 and 13 of the insulating film BLK1 with respect to the semiconductor film CH, the electric field directed from the semiconductor film CH toward the electrode film FG may be selectively formed, as indicated by dashed line arrows in FIG. 7A. Thus, when electric charges are drawn from the semiconductor film CH to the electrode film FG via the insulating film TNL during the write operation, the electric charges may be prevented from being trapped in the insulating film BLK1. As a result, a threshold fluctuation of the memory cell MT due to a leakage of trapped electric charges from the insulating film BLK1 to the electrode film FG may be prevented, so that an occurrence of write errors may be eliminated.

During the operation of erasing information from the memory cell MT, as illustrated in FIG. 7B, a reference voltage is applied to the conductive layer 6 of each word line WL, and an erase voltage is applied to the semiconductor film CH. The erase voltage has an electric potential (e.g., 20 V) for extracting the electric charges (electrons) of the electrode film FG to the semiconductor film CH. The reference voltage has a reference electric potential (e.g., 0 V). As a result, the electric charges stored in the electrode film FG are extracted, and information in the memory cell MT is erased.

At this time, as represented in Equations 1 and 2, the distance from the semiconductor film CH to the insulating film BLK1 is farther than the distance from the semiconductor film CH to the electrode film FG, so that the electric field directed from the electrode film FG toward the semiconductor film CH may be prevented from passing through the insulating film BLK1, as indicated by dashed line arrows in FIG. 7B. Further, as represented in Equations 3 and 4, the side surface 31 of the semiconductor film CH is substantially flat in the Z direction at the Z positions corresponding to the portions 12 and 13 of the insulating films BLK1, the electric field may be prevented from being generated intensively at the Z positions corresponding to the portions 12 and 13. That is, since the electrode film FG protrudes from the portions 12 and 13 of the insulating film BLK1 with respect to the semiconductor film CH, the electric field directed from the semiconductor film CH toward the electrode film FG in the area spaced apart from the insulating film BLK1 may be selectively formed. Thus, when electric charges are extracted from the electrode film FG to the semiconductor film CH via the insulating film TNL during the erase operation, the electric charges may be prevented from being trapped in the insulating film BLK1. As a result, the erase window may be prevented from becoming narrow due to the influence of trapped electric charges, so that an occurrence of erase errors may be eliminated.

As described above, in the embodiment, each memory cell MT of the semiconductor device 1 is configured such that the electrode film FG protrudes from the portions 12 and 13 of the insulating film BLK1 toward the semiconductor film CH, and the portions 12 and 13 of the insulating film BLK1 are recessed from the electrode film FG with respect to the semiconductor film CH. For example, the memory cell MT is configured to satisfy Equations 1 and 2. As a result, electric charges may be prevented from being trapped in the insulating film BLK1 during the write operation, and the threshold fluctuation of the memory cell MT due to, for example, the leakage of trapped electric charges from the insulating film BLK1 to the electrode film FG may be prevented, so that the occurrence of write errors may be eliminated. Further, electric charges may be prevented from being trapped in the insulating film BLK1 during the erase operation, so that the erase window may be prevented from becoming narrow due to the influence of trapped electric charges, so that the occurrence of erase errors may be eliminated. As a result, the operation reliability of the semiconductor device 1 may be improved.

Further, in the embodiment, each memory cell MT of the semiconductor device 1 is configured such that the side surface 31 of the semiconductor film CH facing the electrode film FG is substantially flat at the Z positions corresponding to the portions 12 and 13 of the insulating film BLK1. For example, the memory cell MT is configured to satisfy Equations 3 and 4. As a result, electric charges may be prevented from being generated intensively at each of the Z positions on the side surface 31 of the semiconductor film CH that correspond to the portions 12 and 13, so that the occurrence of write errors may be eliminated, and the occurrence of erase errors may be eliminated.

Figure 8:
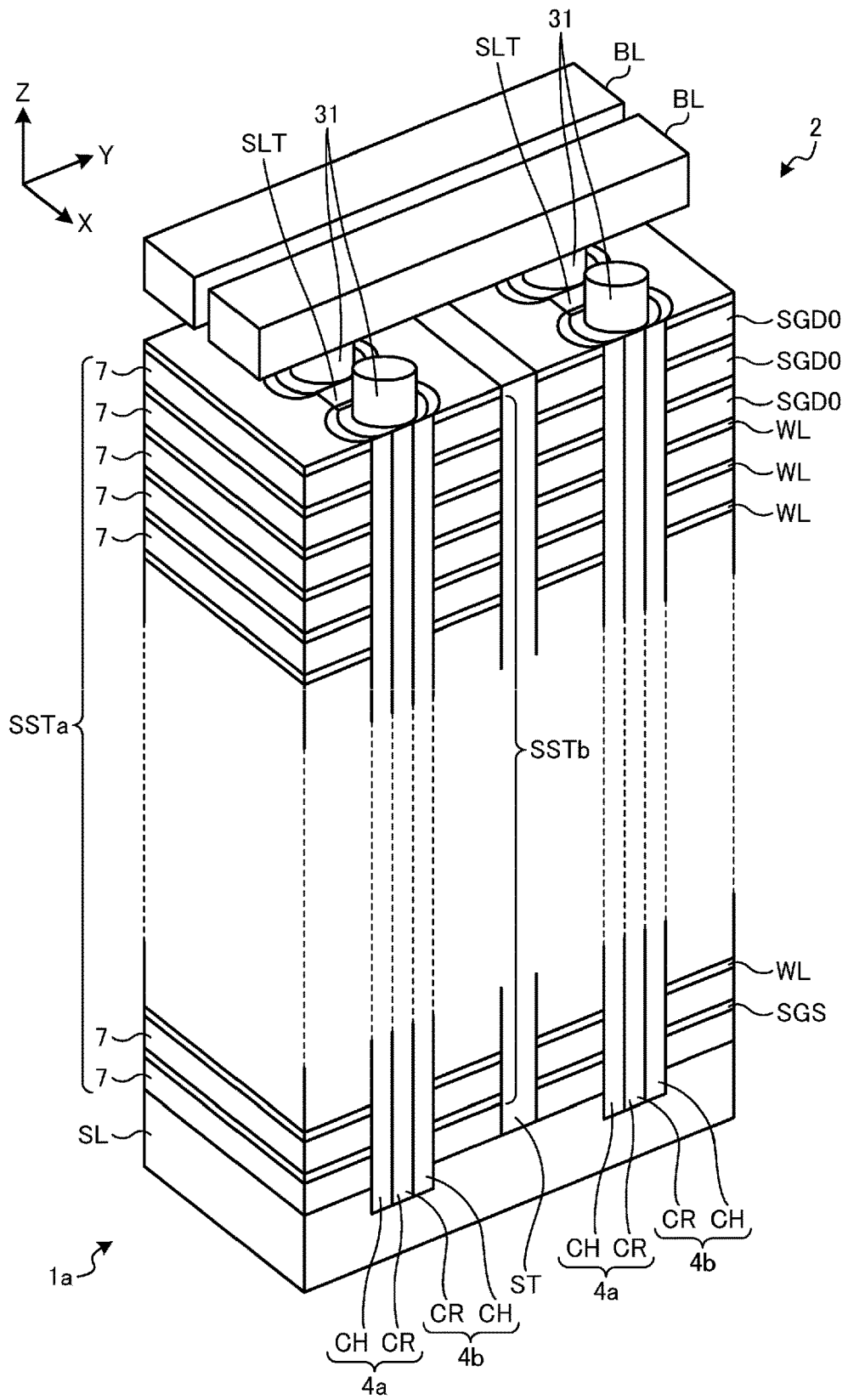
FIG. 8 is a perspective view illustrating a schematic configuration of a semiconductor device according to a modification of the embodiment.

The technical idea of the present embodiment may be applied to a twin memory cell type semiconductor device configured with two memory cells divided in the Y direction with respect to the cylindrical semiconductor film CH. The twin memory cell type semiconductor device may be configured as illustrated in FIG. 8. FIG. 8 is a perspective view illustrating a schematic configuration of a semiconductor device 1a according to a modification of the embodiment.

As illustrated in FIG. 8, in the semiconductor device 1a, a plurality of split films SLT are added. Each split film SLT may be formed of a material including an insulator (e.g., silicon oxide) as a main component. The plurality of split films SLT are arranged in the X direction to fill the spaces between the plurality of cylindrical semiconductor films CH and the insulating films TNL which are arranged in the X direction. Each split film SLT extends in the XZ direction between the plurality of semiconductor films CH and the insulating films TNL. As a result, the plurality of split films SLT split the stacked structure SST (see FIG. 1) into a −Y-side stacked structure SSTa and a +Y-side stacked structure SSTb, and split the columnar body 4 (see FIG. 1) into a −Y-side columnar body 4a and a +Y-side columnar body 4b. The stacked structure SSTa is disposed on the −Y side of the semiconductor films CH and the insulating films TNL, and the stacked structure SSTb is disposed on the +Y side of the semiconductor films CH and the insulating films TNL. The columnar body 4a extends to penetrate the +Y-side end of the stacked structure SSTa in the Z direction, and the columnar body 4*b* extends to penetrate the −Y-side end of the stacked structure SSTb in the Z direction.

Figure 9:
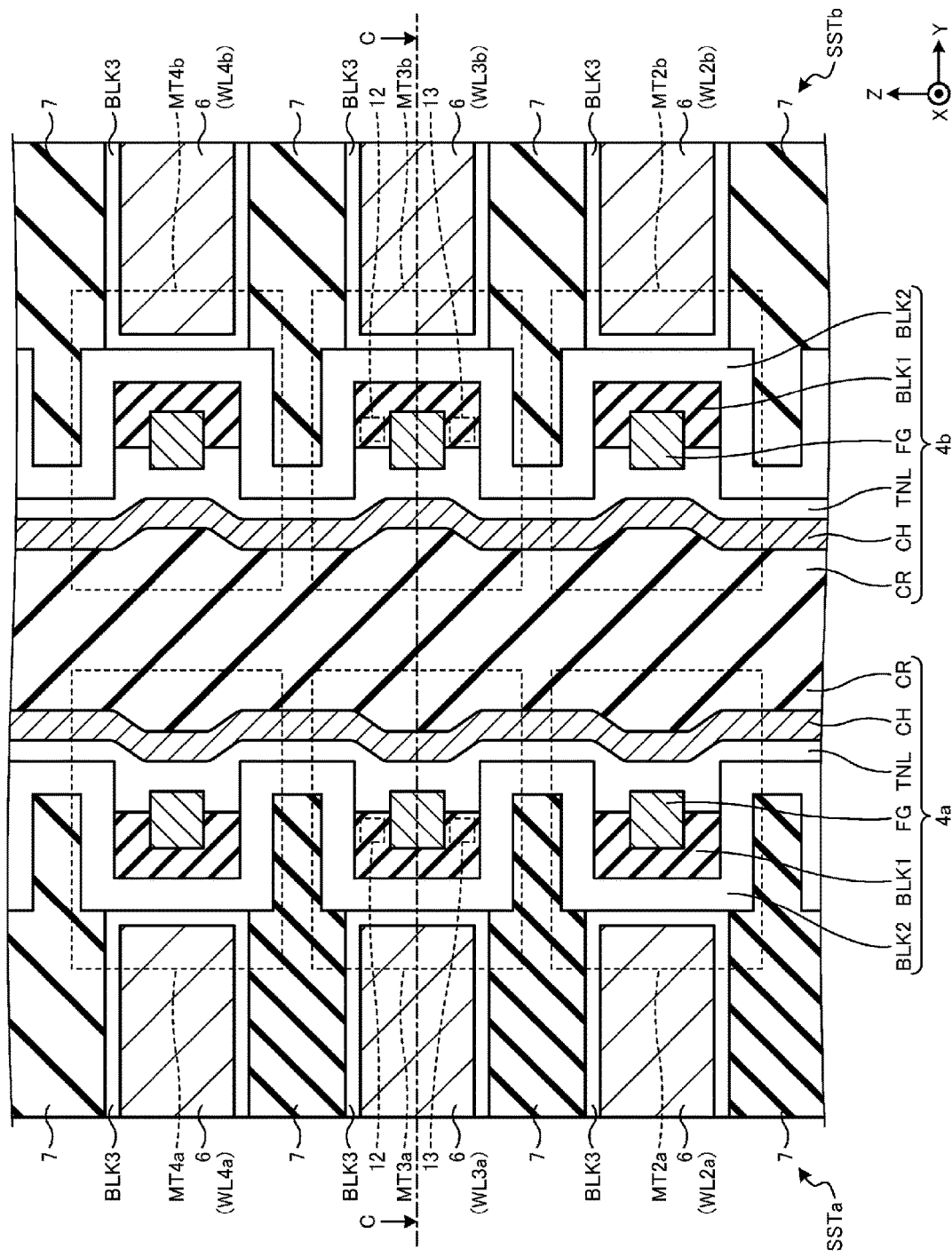
FIG. 9 is a vertical cross-sectional view illustrating a configuration of a memory cell array according to a modification of the embodiment.
Figure 10:
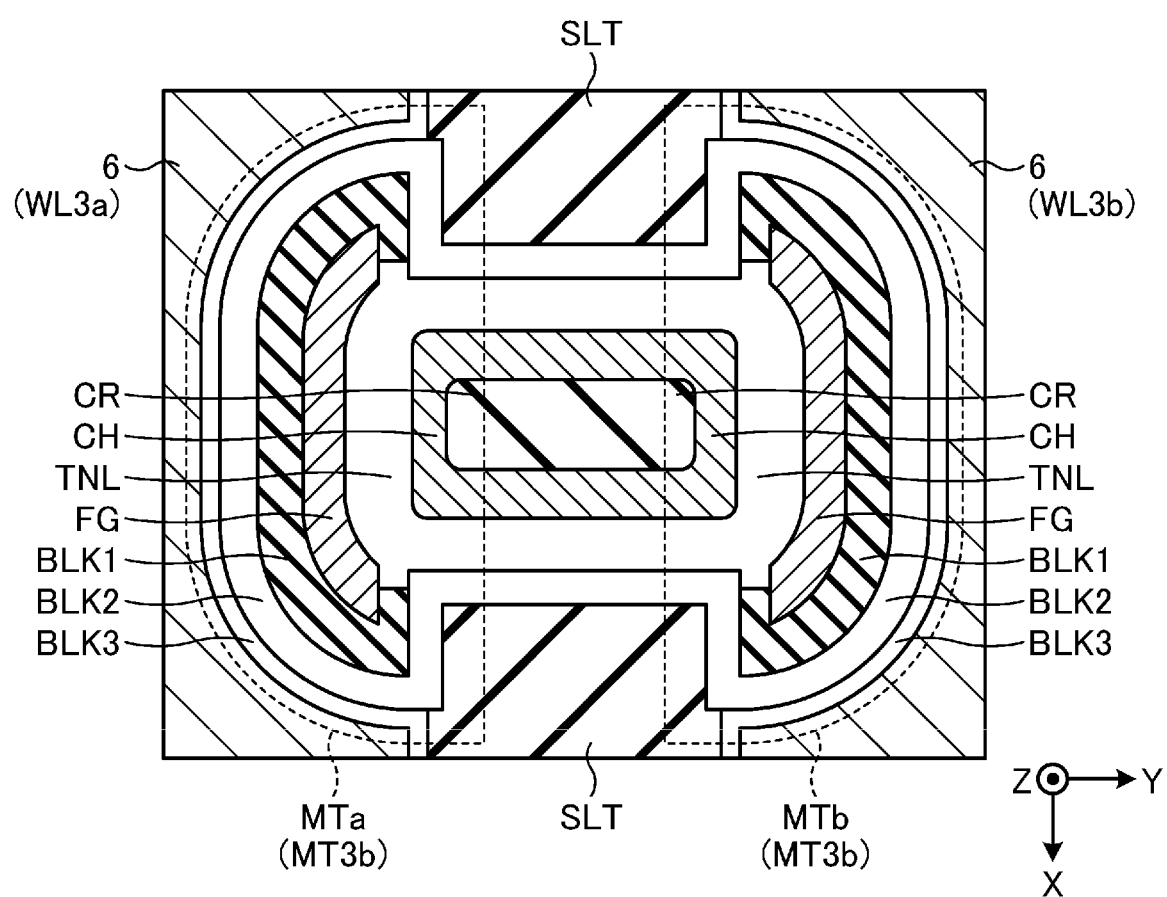
FIG. 10 is a horizontal cross-sectional view illustrating a configuration of a memory cell according to a modification of the embodiment.

Thus, as illustrated in FIGS. 9 and 10, the split film SLT splits the memory cell MT into memory cells MTa and MTb. As a result, in the semiconductor device 1*a*, the arrangement density of the memory cells MTa and MTb may be easily improved. FIG. 9 is a vertical (YZ direction) cross-sectional view illustrating a configuration of a memory cell array 2 according to the modification of the embodiment. FIG. 10 is a horizontal (XY direction) cross-sectional view illustrating the configuration of the memory cell MT according to the modification of the embodiment, and is a cross-sectional view taken by cutting FIG. 9 along the line C-C in the XY direction.

The memory cell MTa is formed at a position where the word line WL of the stacked structure SSTa and the columnar body 4*a* intersect each other. The memory cell MTb is formed at a position where the word line WL of the stacked structure SSTb and the columnar body 4*b* intersect each other.

For example, the split film SLT splits the electrode film FG (see FIG. 5) in the Y direction, to divide the electrode film FG into the electrode film FG of the memory cell MTa and the electrode film FG of the memory cell MTb. The split film SLT splits the insulating film BLK1 (see FIG. 5) in the Y direction, to divide the insulating film BLK1 into the insulating film BLK1 of the memory cell MTa and the insulating film BLK1 of the memory cell MTb. The split film SLT splits the insulating film BLK2 (see FIG. 5) in the Y direction, to divide the insulating film BLK2 into the insulating film BLK2 of the memory cell MTa and the insulating film BLK2 of the memory cell MTb. As a result, the split film SLT splits the memory cell MT into the memory cells MTa and MTb. Since the memory cells MTa and MTb include separate control gates (word lines WL), and thus, may be driven independently from each other.

As illustrated in FIG. 9, the modification is the same as the embodiment in that each of the memory cells MTa and MTb is configured such that the electrode film FG protrudes from the portions 12 and 13 of the insulating film BLK1 toward the semiconductor film CH, and the portions 12 and 13 of the insulating film BLK1 are recessed from the electrode film FG with respect to the semiconductor film CH. With this configuration as well, electric charges may be prevented from being trapped in the insulating film BLK1 during the write operation, so that the threshold fluctuation of the memory cell MT due to the leakage of trapped charges from the insulating film BLK1 to the electrode film FG may be prevented, and the occurrence of write errors may be eliminated. Further, electric charges may be prevented from being trapped in the insulating film BLK1 during the erase operation, so that the erase window may be prevented from becoming narrow due to the influence of trapped electric charges, and the occurrence of erase errors may be eliminated.

Further, in each of the memory cells MTa and MTb, the modification is the same as the embodiment in that the memory cell MT is configured such that the side surface 31 of the semiconductor film CH facing the electrode film FG is substantially flat at the Z positions corresponding to the portions 12 and 13 of the insulating film BLK1. With this configuration as well, electric charges may be prevented from being generated intensively at each of the Z positions on the side surface 31 of the semiconductor film CH that correspond to the portions 12 and 13, so that the occurrence of write errors may be eliminated, and the occurrence of erase errors may be eliminated.

Further, the semiconductor device 1*a* illustrated in FIGS. 8 to 10 may be manufactured as illustrated in FIGS. 11A to 11F through 14A to 14D. FIGS. 11A to 11F through 14A to 14D are each a view illustrating a method of manufacturing the semiconductor device 1*a* according to the modification of the embodiment. FIGS. 11A, 11C, 11E, 12A, 12C, 12E, 13A, 13C, 14A, and 14C are XY cross-sectional views illustrating the method of manufacturing the semiconductor device 1*a*, and represent XY cross-sectional views corresponding to memory cells MT3*a* and MT3*b* illustrated in FIG. 9. FIGS. 11B, 11D, 11F, 12B, 12D, 12F, 13B, 13D, 14B, and 14D are YZ cross-sectional views illustrating the method of manufacturing the semiconductor device 1*a*, and represent YZ cross-sectional views corresponding to the memory cells MT2*a*, MT2*b*, MT3*a*, and MT3*b* illustrated in FIG. 9.

In the steps illustrated in FIGS. 11A and 11B, a transistor is formed on the substrate SUB, and a contact plug, a wiring film, a via plug and others are formed on the substrate SUB while forming an interlayer insulating film around them. As a result, the peripheral circuit 100 is formed. Then, the interlayer insulating film 81 is deposited on the +Z side of the substrate SUB. The interlayer insulating film 81 may be formed of a material containing an insulator (e.g., semiconductor oxide such as silicon oxide or the like) as a main component (see FIG. 1). The conductive layer 3 (see FIG. 4) is deposited on the +Z side of the interlayer insulating film 81. The conductive layer 3 may be formed of a material containing a semiconductor containing impurities (e.g., silicon) as a main component or a material containing a conductor (e.g., metal such as tungsten or the like) as a main component. An insulating layer 7*i* and a sacrificial layer 5*i* are alternately deposited a plurality of times on the +Z side of the conductive layer 3, to form a stacked structure SSTi. The insulating layer 7*i* may be formed of a material containing an oxide (e.g., silicon oxide) as a main component. The sacrificial layer 5*i* may be formed of a material containing nitride (e.g., silicon nitride) as a main component. Each insulating layer 7*i* and each sacrificial layer 5*i* may be deposited with substantially the same film thickness.

In the steps illustrated in FIGS. 11C and 11D, a resist pattern is formed in the uppermost insulating layer 7*i*, which is opened in a line shape in which a formation position of a split film SLTi extends in the X direction. An anisotropic etching such as a RIE (reactive ion etching) method is performed using the resist pattern as a mask, to form a groove 9 penetrating the stacked structure SSTi in the XZ direction. Then, the split film SLTi is embedded in the groove 9. The split film SLTi may be formed of a material containing an insulator (e.g., silicon oxide) as a main component. The split film SLTi extends inside the stacked structure SSTi in the XZ direction, to split the stacked structure SSTi in the Y direction. The split film SLTi splits the stacked structure SSTi into a −Y-side stacked structure SSTia and a +Y-side stacked structure SSTib. In each of the stacked structures SSTia and SSTib, an insulating layer 7*j* and a sacrificial layer 5*j* are alternately stacked a plurality of times.

In the steps illustrated in FIGS. 11E and 11F, a resist pattern opened at a formation position of a memory hole 10*i* is formed on the uppermost insulating layer 7*j* of each of the stacked structures SSTia and SSTib, and the split film SLTi. An anisotropic etching such as the RIE method is performed using the resist pattern as a mask, to form the memory hole 10*i* which penetrates the split film SLTi, the +Y-side end of the stacked structure SSTa, and the −Y-side end of the stacked structure SSTb to reach the conductive layer 3. In the XY plan view, the memory hole 10*i* extends from the +Y-side end of the stacked structure SSTa to reach the −Y-side end of the stacked structure SSTb, while crossing the split film SLT in the Y direction. The width of the memory hole 10*i* in the Y direction is slightly larger than the width of the split film SLT in the Y direction.

In the steps illustrated in FIGS. 12A and 12B, a sacrificial layer recess process is performed to etch and retreat the side surface of the sacrificial layer 5 exposed in the memory hole 10*j*. When the sacrificial layer 5 is formed of a material containing silicon nitride as a main component, the sacrificial layer recess process is also referred to as an SiN recess process or an N recess process. As a result of the sacrificial layer recess process, a recess 10*j*1 is formed in the inner surface of the memory hole 10*j*. The recess 10*j*1 is formed to be caved at the Z position of the sacrificial layer 5 in each of the stacked structures SSTa and SSTb, in the direction away from the center of the memory hole 10*j* with respect to the inner surface of the memory hole 10*j*. For example, the inner surface of the memory hole 10*j* is wet-etched using an etchant having a high etching selectivity of the sacrificial layer 5 with respect to the insulating layer 7. Alternatively, the inner surface of the memory hole 10*j* is dry-etched under a condition of an isotropic etching using a processing gas having a high etching selectivity of the sacrificial layer 5 with respect to the insulating layer 7. As a result, the side surface of the sacrificial layer 5 exposed in the memory hole 10*j* may be etched and retreated, thereby forming the recess 10*j*1 in the inner side surface of the memory hole 10*j*. The recess width (recess amount) of the recess 10*j*1 with respect to the inner surface of the memory hole 10*j* may be adjusted by an etching time. The width of the recess 10*j*1 in the Z direction is substantially equal to the film thickness of the sacrificial layer 5.

In the steps illustrated in FIGS. 12C and 12D, the insulating film BLK2, the insulating film BLK1, and the electrode film FG are deposited in this order on the side surface and the bottom surface of the memory hole 10*j*. At this time, the insulating film BLK2, the insulating film BLK1, and the electrode film FG are also deposited in this order in the recess 10*j*1. The insulating film BLK2 may be formed of a material containing oxide (e.g., silicon oxide, metal oxide, or a stack thereof) as a main component. The insulating film BLK1 may be formed of a material containing an insulator having a higher permittivity than that of the insulating film BLK2 (e.g., metal oxide, metal nitride, or metal carbide having a higher relative permittivity than that of silicon oxide, such as $Si_3N_4$, $Al_2O_3$, $HfO_2$, HfSiON, HfAlON or the like), as a main component. The electrode film FG may be formed of a material containing a conductor (e.g., polysilicon imparted with a conductivity) as a main component.

In the steps illustrated in FIGS. 12E and 12F, the electrode film FG is etched back and removed by an isotropic etching such as a wet etching.

Figure 13A:
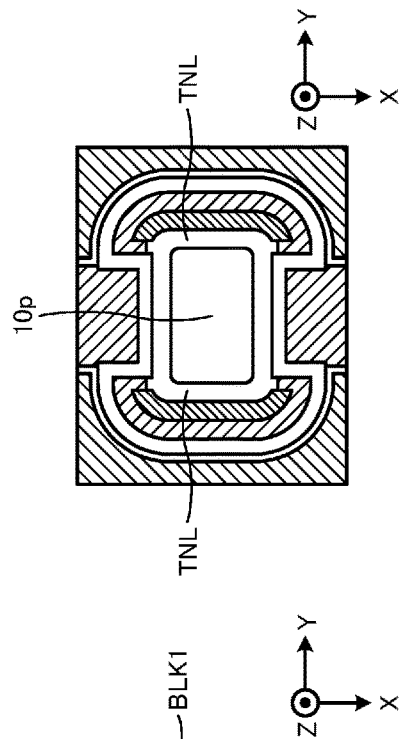
FIGS. 13A to 13D are views illustrating a method of manufacturing a semiconductor device according to a modification of the embodiment.
Figure 13C:
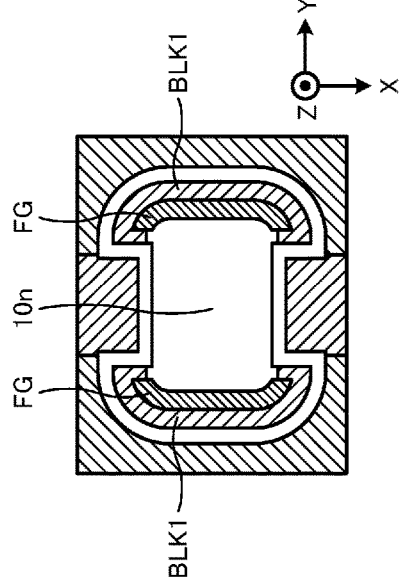
Figure 13B:
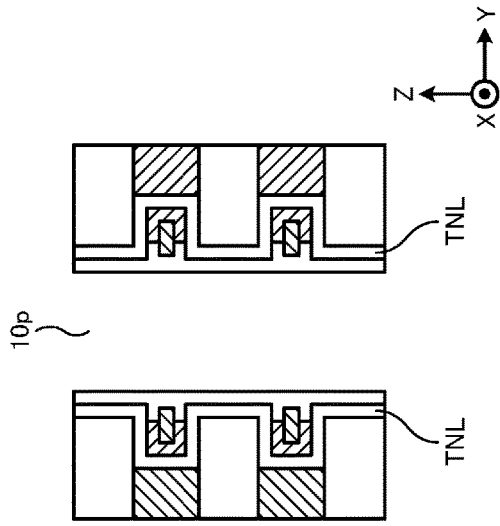

In the steps illustrated in FIGS. 13A and 13B, an insulating film recess process is performed to etch and retreat the insulating film BLK1 exposed in the memory hole 10*n*. For example, the inner surface of the memory hole 10*j* is wet-etched using an etchant having a high etching selectivity of the insulating film BLK1 with respect to the insulating film BLK2 and the electrode film FG. Alternatively, the inner surface of the memory hole 10*j* is dry-etched under a condition of an isotropic etching using a processing gas having a high etching selectivity of the insulating film BLK1 with respect to the insulating film BLK2 and the electrode film FG. As a result, recesses 10*n*2 and 10*n*3 are formed in the inner side surface 10*n*1 of the memory hole 10*n*. The recess 10*n*2 is formed to be caved at the Z position of the electrode film FG on the +Z side in the insulating film BLK1, in the direction away from the center of the memory hole 10*n* with respect to the inner side surface 10*n*1. The recess 10*n*3 is formed to be caved at the Z position of the electrode film FG on the −Z side in the insulating film BLK1, in the direction away from the center of the memory hole 10*n* with respect to the inner side surface 10*n*1.

Figure 13D:
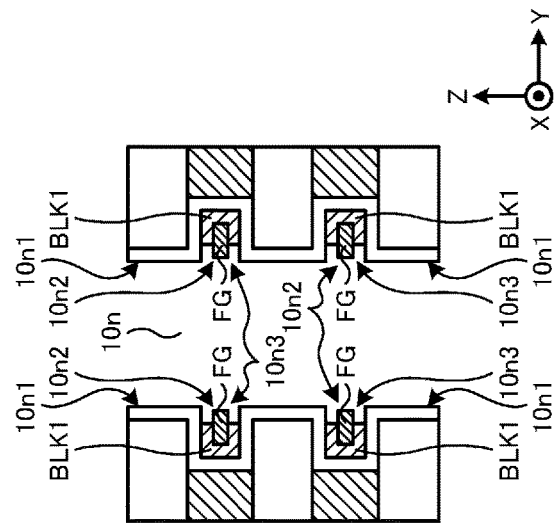

In the steps illustrated in FIGS. 13C and 13D, the insulating film TNL is deposited on the side surface and the bottom surface of the memory hole 10*n*. At this time, the insulating film TNL is also deposited in the recesses 10*n*2 and 10*n*3. The insulating film TNL may be formed of a material containing oxide (e.g., silicon oxide, metal oxide, or a stack thereof) as a main component. The insulating film TNL on the bottom surface of the memory hole 10*p* is selectively removed.

In the steps illustrated in FIGS. 14A and 14B, the semiconductor film CH is deposited on the side surface and the bottom surface of a memory hole 10*p*. The semiconductor film CH may be formed of a material containing a semiconductor that does not substantially contain impurities (e.g., polysilicon) as a main component. Then, the core member CR is embedded in the memory hole 10*p*. The core member CR may be formed of a material containing an insulator (e.g., semiconductor oxide such as silicon oxide) as a main component. As a result, the columnar body 4*a* is formed to penetrate the +Y-side end of the stacked structure SSTa in the Z direction, and the columnar body 4*b* is formed to penetrate the −Y-side end of the stacked structure SSTb in the Z direction.

In the steps illustrated in FIGS. 14C and 14D, the sacrificial layer 5 of the stacked structure SSTa and the sacrificial layer 5 of the stacked structure SSTb are removed. The insulating film BLK3 is deposited on the exposed surface of the void formed by the removal. The insulating film BLK3 may be formed of a material containing an insulator (e.g., aluminum oxide) as a main component. Then, the conductive layer 6 is embedded in the void. The conductive layer 6 may be formed of a material containing a conductor (e.g., metal such as tungsten or the like) as a main component. As a result, the stacked structure SSTa in which the conductive layer 6 and the insulating layer 7 are alternately and repeatedly stacked is formed, and the stacked structure SSTb in which the conductive layer 6 and the insulating layer 7 are alternately and repeatedly stacked is formed.

As described above, the semiconductor device 1*a* illustrated in FIGS. 8 to 10 may be manufactured by the manufacturing method illustrated in FIGS. 11A to 11F through 14A to 14D.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor device comprising:
  a first stacked structure including a plurality of first conductive layers stacked in a first direction;
  a semiconductor film extending in the first direction;

a first electrode film disposed between a corresponding one of the first conductive layers and the semiconductor film, and extending in a second direction perpendicular to the first direction; and a first insulating film disposed between the first conductive layer and the first electrode film, and including:
- a first portion extending along a first sidewall of the first electrode film that faces the first conductive layer;
- a second portion that extends from an upper end of the first portion in a third direction perpendicular to the first and second directions to extend along an upper surface of the first electrode film; and
- a third portion that extends from a lower end of the first portion in the third direction to extend along a lower surface of the first electrode film, wherein a first distance in the third direction between an end surface of the second or third portion and a sidewall of the semiconductor film is larger than a second distance in the third direction between a second sidewall of the first electrode film and the sidewall of the semiconductor film, wherein the sidewall of the semiconductor film has a first stepped surface at a position corresponding to the second portion, and a second stepped surface at a position corresponding to the third portion, and the first or second stepped surface and a flat surface of the sidewall of the semiconductor film form an obtuse angle.

2. The semiconductor device according to claim 1, further comprising a second insulating film disposed between the semiconductor film and the first electrode film,
wherein a permittivity of the first insulating film is higher than a permittivity of the second insulating film.

3. The semiconductor device according to claim 2, further comprising a third insulating film disposed between the first conductive layer and the first insulating film,
wherein the permittivity of the first insulating film is higher than a permittivity of the third insulating film.

4. The semiconductor device according to claim 1, further comprising:
- a second stacked structure disposed opposite the semiconductor film from the first stacked structure in the third direction, and including a plurality of second conductive layers stacked in the first direction;
- an insulator disposed between the first and second stacked structures in the third direction, and extending in the first and second directions while being adjacent to the semiconductor film in the second direction;
- a second electrode film disposed between a corresponding one of the second conductive layers and the semiconductor film; and
- a fourth insulating film disposed between the second conductive layer and the second electrode film, and including:
  - a fourth portion extending along a first sidewall of the second electrode film that faces the second conductive layer;
  - a fifth portion that extends from an upper end of the fourth portion in the third direction to extend along an upper surface of the second electrode film; and
  - a sixth portion that extends from a lower end of the fourth portion in the third direction to extend along a lower surface of the second electrode film, wherein a third distance in the third direction between an end surface of the fifth or sixth portion and the sidewall of the semiconductor film is larger than a fourth distance in the third direction between an end surface of the second electrode film and the sidewall of the semiconductor film.

5. The semiconductor device according to claim 4, wherein the sidewall of the semiconductor film has a first stepped surface at a position corresponding to the second portion, and a second stepped surface at a position corresponding to the third portion,
the first or second stepped surface and a flat surface of the sidewall of the semiconductor film form a first obtuse angle,
the side surface of the semiconductor film has a third stepped surface at a position corresponding to the fifth portion, and a fourth stepped surface at a position corresponding to the sixth portion, and
the third or fourth stepped surface and the flat surface of the sidewall of the semiconductor film form a second obtuse angle.

6. The semiconductor device according to claim 1, wherein a first memory cell is formed at an intersection of the first conductive layer and the semiconductor film.

7. The semiconductor device according to claim 5, wherein a second memory cell is formed at an intersection of the second conductive layer and the semiconductor film.

8. The semiconductor device according to claim 1, wherein the second portion of the first insulating film partially covers the upper surface of the first electrode film.

9. The semiconductor device according to claim 1, wherein the third portion of the first insulating film partially covers the lower surface of the first electrode film.

10. The semiconductor device according to claim 1, wherein the first electrode film and the semiconductor film are configured to exchange electrons.

\* \* \* \* \*